(12) United States Patent
Lee et al.

(10) Patent No.: US 11,977,122 B2
(45) Date of Patent: May 7, 2024

(54) BATTERY INSPECTION APPARATUS

(71) Applicant: LG ENERGY SOLUTION, LTD., Seoul (KR)

(72) Inventors: Chan-Hee Lee, Daejeon (KR); Young-Seo Kim, Daejeon (KR); Chang-Sin Yeo, Daejeon (KR); Sun-Woo Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 185 days.

(21) Appl. No.: 17/789,250

(22) PCT Filed: Oct. 18, 2021

(86) PCT No.: PCT/KR2021/014517
§ 371 (c)(1),
(2) Date: Jun. 27, 2022

(87) PCT Pub. No.: WO2022/086097
PCT Pub. Date: Apr. 28, 2022

(65) Prior Publication Data
US 2023/0038456 A1    Feb. 9, 2023

(30) Foreign Application Priority Data
Oct. 19, 2020    (KR) ........................ 10-2020-0135361

(51) Int. Cl.
*G01R 31/3835*    (2019.01)
*G01R 31/36*    (2020.01)
(Continued)

(52) U.S. Cl.
CPC ..... *G01R 31/3835* (2019.01); *G01R 31/3644* (2013.01); *G01R 31/374* (2019.01); *G01R 31/52* (2020.01)

(58) Field of Classification Search
CPC ............ G01R 1/06711; G01R 1/07314; G01R 1/07342; G01R 1/07364; G01R 3/00; G01R 31/2886; G01R 31/396
See application file for complete search history.

(56) References Cited

U.S. PATENT DOCUMENTS 3,786,343 A *  1/1974  Ehlers ................ G01R 31/3835
                                                           324/434
6,091,245 A     7/2000  Bertness
(Continued)

FOREIGN PATENT DOCUMENTS

JP    2007-165435 A    6/2007
JP    2010-32346 A     2/2010
(Continued)

OTHER PUBLICATIONS

International Search Report (PCT/ISA/210) issued in PCT/KR2021/014517 dated Jan. 28, 2022.
(Continued)

*Primary Examiner* — Tung X Nguyen
(74) *Attorney, Agent, or Firm* — Birch, Stewart, Kolasch & Birch, LLP (57) ABSTRACT

A battery inspection apparatus capable of self-diagnosing failure is provided. The battery inspection apparatus includes a contact probe, a power supply module, a power cable for providing a path for supplying the power generated by the power supply module to the contact probe, a voltage measuring module, a measuring cable configured to measure a voltage of the contact probe by the voltage measuring module, a switching module configured to selectively connect the voltage measuring module to the power cable or the measuring cable, and a control module configured to determine whether at least one of the contact probe or the power cable is abnormal based on the voltage measurement value of the voltage measuring module according to a connection
(Continued)

state of the switching module. A verification device capable of diagnosing failure of the battery inspection apparatus is also provided.

11 Claims, 5 Drawing Sheets

(51) Int. Cl.
*G01R 31/374* (2019.01)
*G01R 31/52* (2020.01)

(56) References Cited

U.S. PATENT DOCUMENTS

| 2001/0019270 A1* | 9/2001 | Onishi | H01M 10/4285 |
| | | | 324/426 |
| 2013/0241566 A1 | 9/2013 | Sugimura | |
| 2016/0178883 A1 | 6/2016 | Ramey et al. | |
| 2018/0224494 A1 | 8/2018 | Iwanabe et al. | |
| 2019/0250216 A1 | 8/2019 | Kobayashi et al. | |

FOREIGN PATENT DOCUMENTS

| JP | 4866712 B2 | 4/2011 |
| JP | 2016-123080 A | 7/2016 |
| JP | 6097678 B2 | 3/2017 |
| JP | 6178895 B2 | 8/2017 |
| JP | 2017-223580 A | 12/2017 |
| JP | 2018-128440 A | 8/2018 |
| JP | 2019-138757 A | 8/2019 |
| KR | 10-2003-0017776 A | 3/2003 |
| KR | 10-0591441 B1 | 6/2006 |
| KR | 10-2020-0043225 A | 4/2020 |
| KR | 10-2020-0059483 A | 5/2020 |

OTHER PUBLICATIONS

Extended European Search Report dated Jul. 17, 2023 for Application No. 21883166.7.

* cited by examiner

BATTERY INSPECTION APPARATUS

TECHNICAL FIELD

The present application claims priority to Korean Patent Application No. 10-2020-0135361 filed on Oct. 19, 2020 in the Republic of Korea, the disclosures of which are incorporated herein by reference.

The present disclosure relates to battery inspection technology, and more specifically, to a failure verification technology for an apparatus for inspecting a battery.

BACKGROUND ART

Recently, portable devices such as smartphones and laptop computers, transportation means such as electric vehicles, electric kickboards and electric two-wheeled vehicles, and devices for stably supplying and managing power such as an energy storage system (ESS) have been widely used, and so batteries attract more interest and are being developed more actively.

A battery is a component for supplying power to a device or system. In this case, the battery may be used in a form in which one secondary battery supplies power alone as a battery cell or in a form in which a plurality of secondary batteries constitute one battery module or one battery pack to supply power.

The battery may include a non-rechargeable primary battery and a rechargeable secondary battery. In particular, since secondary batteries are recharged and thus may be used repeatedly for a long period of time, the secondary batteries are being widely used in various fields in recent years. These secondary batteries may include various types of batteries, but among them, lithium secondary batteries are more in the limelight and their utilization is rapidly increasing because they have a larger capacity than nickel-cadmium batteries or nickel-hydrogen batteries and also have a higher energy density per unit weight. A lithium secondary battery mainly uses a lithium-based oxide and a carbon material as a positive electrode active material and a negative electrode active material, respectively. The lithium secondary battery includes an electrode assembly in which a positive electrode plate and a negative electrode plate respectively coated with the positive electrode active material and the negative electrode active material with a separator interposed therebetween, and an exterior for sealing and accommodating seals the electrode assembly together with an electrolyte.

Meanwhile, depending on the shape of the battery case, the secondary battery may be classified into a can-type secondary battery in which the electrode assembly is included in a metal can and a pouch-type secondary battery in which the electrode assembly is included in a pouch of an aluminum laminate sheet. A secondary battery is generally manufactured through a process of injecting a liquid-state electrolyte, namely an electrolytic solution, in a state where the electrode assembly is accommodated in the battery case, and then sealing the battery case.

In such a lithium secondary battery, various types of faults may occur due to various causes during the manufacturing process or use. In particular, some of manufactured secondary batteries may exhibit a voltage drop behavior greater than the self-discharge rate, which is called a low-voltage fault.

The low-voltage fault phenomenon of a secondary battery may be caused by several reasons. For example, a low-voltage fault may occur if a part of the separator is damaged or punctured in the process of manufacturing a secondary battery, or if the separator is folded. Alternatively, when a metal foreign material such as iron or copper is present on the positive electrode plate of the electrode assembly, such a metal foreign material may grow into a dendrite at the negative electrode, which may cause an internal short circuit of the secondary battery and generating a low-voltage fault.

Such a low-voltage fault may cause failure or damage while the secondary battery is in use, and in severe cases, may cause ignition. Accordingly, various techniques for inspecting a low-voltage fault or the like have been proposed or attempted so far in order to detect in advance a secondary battery having a problem such as a low-voltage fault.

As an example of the low-voltage fault inspection technique, there is an inspection by the 4-terminal method. The 4-terminal method is a technique of inspecting a low-voltage fault of a secondary battery by measuring both-end voltage while supplying current to both ends of the secondary battery and then calculating an internal resistance. However, in this inspection technique, if an abnormality occurs in a contact portion at both ends of a cable for or a secondary battery supplying current, the low-voltage fault may not be properly detected. For example, even if there is no problem in the secondary battery in reality and there is an abnormality in the cable or the contact portion, it may be determined from the inspection result that there is a problem in the secondary battery. Therefore, in this situation, the accuracy of the inspection may be lowered.

DISCLOSURE

Technical Problem

The present disclosure is designed to solve the problems of the related art, and therefore the present disclosure is directed to providing a battery inspection apparatus capable of diagnosing failure by itself, or a verification device capable of diagnosing failure of the battery inspection apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery inspection apparatus for inspecting a state of a battery, comprising: a contact probe configured to contact a terminal of the battery; a power supply module configured to generate and supply power; a power cable located between the power supply module and the contact probe to provide a path for supplying the power generated by the power supply module to the contact probe; a voltage measuring module configured to measure a voltage; a measuring cable located between the voltage measuring module and the contact probe, the measuring cable being configured to measure a voltage of the contact probe by the voltage measuring module; a switching module configured to selectively connect the voltage measuring module to the power cable or the measuring cable; and a control module configured to control the switching module and determine whether at least one of the contact probe or the power cable is abnormal based on the voltage measurement value of the voltage measuring module according to a connection state of the switching module.

Here, the battery inspection apparatus according to the present disclosure may further comprise a pressing module configured to press the battery, and when power is supplied to the battery by the power supply module in a state where the battery is pressed by the pressing module, the control module may be configured to detect an internal short circuit of the battery based on the voltage measurement value of the voltage measuring module in a state where the switching module is controlled to connect the voltage measuring module and the measuring cable.

In addition, the battery may be a pouch-type secondary battery, the terminal may be an electrode lead of the pouch-type secondary battery, and the contact probe may be configured to contact the electrode lead of the pouch-type secondary battery.

In addition, the control module may be configured to determine whether the at least one of the contact probe or the power cable is abnormal by comparing the voltage measurement value with a previously stored criterion voltage value.

In addition, the criterion voltage value to be compared with the voltage measurement value may be different for different temperature ranges.

In addition, the control module may be configured to determine whether the at least one of the contact probe or the power cable is abnormal based on a first voltage value measured by the voltage measuring module in a state where the switching module is controlled to connect the voltage measuring module to the power cable.

In addition, the control module may be configured to determine whether the contact probe is abnormal based on a second voltage value measured by the voltage measuring module in a state where the switching module is controlled to connect the voltage measuring module to the measuring cable.

In addition, when it is determined based on the first voltage value that the at least one of the contact probe or the power cable is abnormal, the control module may be configured to determine which of the contact probe and the power cable is abnormal based on the second voltage value.

In addition, the control module may be configured to control the switching module first to connect the voltage measuring module and the power cable, and then control the switching module to connect the voltage measuring module and the measuring cable only when it is determined that the at least one of the contact probe and the power cable is abnormal.

In addition, the battery inspection apparatus according to the present disclosure may further comprise a test kit configured to have a predetermined resistance value and to be contacted by the contact probe instead of the battery.

In another aspect of the present disclosure, there is also provided a battery inspection unit abnormality verification for verifying whether a battery inspection unit including a contact probe, a power supply module, a power cable, a voltage measuring module and a measuring cable is abnormal, the battery inspection unit abnormality verification device comprising: a switching module configured to be connectable to the voltage measuring module, the power cable and the measuring cable and to selectively connect the voltage measuring module to the power cable or the measuring cable; and a control module configured to control the switching module and determine whether at least one of the contact probe or the power cable is abnormal based on a voltage measurement value of the voltage measuring module according to a connection state of the switching module.

Advantageous Effects

According to an embodiment of the present disclosure, a battery inspection apparatus capable of diagnosing failure by itself may be provided.

Therefore, according to the present disclosure, the inspection accuracy of the battery inspection apparatus may be further improved.

In particular, according to an embodiment of the present disclosure, by diagnosing whether the cable or the contact probe is abnormal, it is possible to prevent the battery from being diagnosed as failure even though there is no abnormality in the battery.

In addition, according to another embodiment of the present disclosure, an abnormality verification device that may be applied to a device for inspecting a battery using an existing 4-terminal method may be provided.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
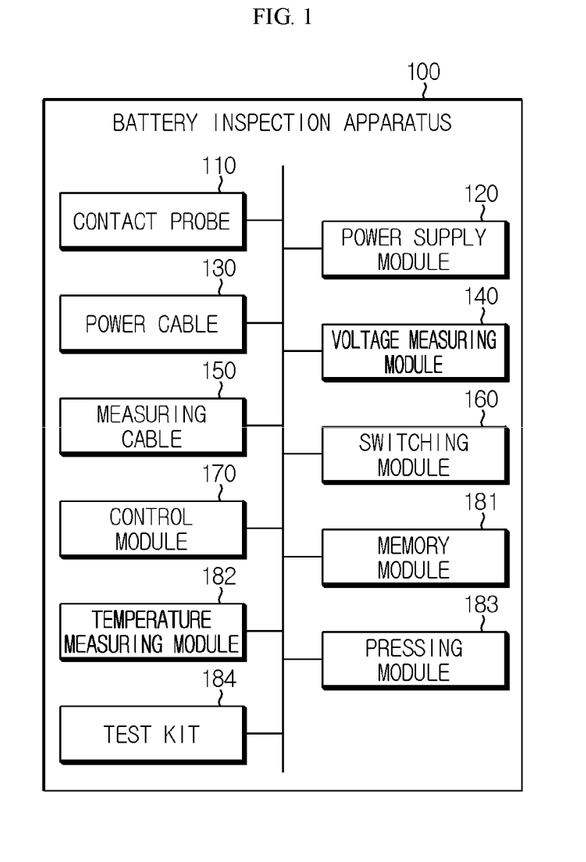
FIG. 1 is a block diagram schematically showing the configuration of a battery inspection apparatus according to an embodiment of the present disclosure.
Figure 2:
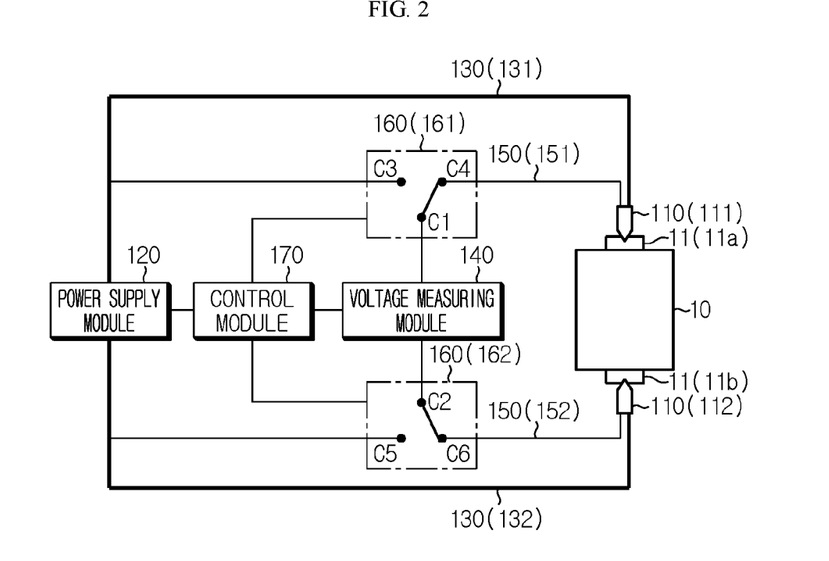
FIG. 2 is a circuit diagram showing the configuration in which the battery inspection apparatus according to an embodiment of the present disclosure is connected to a battery.

FIG. 1 is a block diagram schematically showing the configuration of a battery inspection apparatus 100 according to an embodiment of the present disclosure, and FIG. 2 is a circuit diagram showing the configuration in which the battery inspection apparatus 100 according to an embodiment of the present disclosure is connected to a battery 10.

Referring to FIGS. 1 and 2, the battery inspection apparatus 100 according to the present disclosure includes a contact probe 110, a power supply module 120, a power cable 130, a voltage measuring module 140, a measuring cable 150, a switching module 160, and a control module 170.

As shown in FIG. 2, the battery inspection apparatus 100 according to the present disclosure may be connected to a battery 10 and configured to inspect a state of the battery 10. Here, the battery 10 may be one or more secondary batteries. That is, the battery inspection apparatus 100 according to the present disclosure may be configured to inspect one or more secondary batteries. For example, the battery inspection apparatus 100 according to the present disclosure may be an apparatus configured to inspect one pouch-type secondary battery, as shown in FIG. 2. In addition, the battery inspection apparatus 100 according to the present disclosure may be configured to inspect one can-type secondary battery. Moreover, the battery inspection apparatus 100 according to the present disclosure may be an apparatus configured to inspect a battery module or a battery pack serving as the battery 10.

In addition, the state of the battery 10 inspected by the battery inspection apparatus 100 according to the present disclosure may be an internal state of the battery 10. For example, the battery inspection apparatus 100 according to the present disclosure may be an apparatus configured to measure an internal resistance or an internal impedance of the battery 10. Further, the battery inspection apparatus 100 according to the present disclosure may be an apparatus configured to inspect an internal short circuit or a low voltage of the battery 10.

The contact probe 110 may be configured to be able to contact a terminal of the battery 10. Here, the terminal of the battery 10 means a configuration provided to allow power to flow into and out of the battery 10, and may be, for example, an electrode lead 11 of a pouch-type secondary battery. Alternatively, in the case of a battery pack, the terminal of the battery 10 may mean a pack terminal of the battery pack.

In particular, as shown in FIG. 2, when the battery 10 to be tested is a pouch-type secondary battery, the contact probe 110 may be configured to be able to contact the electrode lead 11 of the pouch-type secondary battery.

Moreover, the contact probe 110 may be configured in various forms to facilitate contact with the terminal of the battery 10. For example, the contact probe 110 may be configured in a shape such as tongs or a pin.

Meanwhile, the terminal of the battery 10 generally includes a positive electrode terminal and a negative electrode terminal. Accordingly, the contact probe 110 may include two unit probes 111, 112 so as to be in contact with these two different types of terminals, respectively. The unit probes may be referred to as a positive electrode probe 111 and a negative electrode probe 112. In this case, the positive electrode probe 111 may be configured to contact a positive electrode terminal of the battery 10, for example a positive electrode lead 11a of the pouch-type secondary battery, and the negative electrode probe 112 may be configured to contact a negative electrode terminal of the battery 10, for example a negative electrode lead 11b of the pouch-type secondary battery.

The power supply module 120 may be configured to generate power and supply the generated power. In particular, the power supply module 120 may supply current as a power source. In this case, the power supply module 120 may be configured to supply a current of a constant magnitude. The power supply module 120 may adopt various power supply configurations known at the time of filing of this application.

The power cable 130 may be located between the power supply module 120 and the contact probe 110. In addition, both ends of the power cable 130 may be respectively connected to the power supply module 120 and the contact probe 110 to electrically connect them. In particular, the power cable 130 may provide a path for supplying the power generated by the power supply module 120 to the contact probe 110. For example, the power cable 130 may supply the current generated by the power supply module 120 to the contact probe 110. In addition, the power transmitted through the power cable 130 as described above may be supplied to the battery 10, for example the pouch-type secondary battery, through the contact probe 110.

Since the power cable 130 may be respectively connected between the power supply module 120 and the positive electrode probe 111 and between the power supply module 120 and the negative electrode probe 112, a positive electrode power cable 131 and a negative electrode power cable 132 may be provided. Here, the positive electrode power cable 131 may connect the power supply module 120 and the positive electrode probe 111 to each other, and the negative electrode power cable 132 may connect the power supply module 120 and the negative electrode probe 112 to each other. In this case, the power supply module 120, the positive electrode power cable 131, the positive electrode probe 111, the battery 10, the negative electrode probe 112, and the negative electrode power cable 132 may constitute one closed circuit, so that the power may be supplied to the battery 10 by the power supply module 120.

The power cable 130 may be configured in the form of an electric wire, but the present disclosure is not necessarily limited to this form, and may be configured in various forms capable of transmitting power.

The voltage measuring module 140 may be configured to measure a voltage. For example, the voltage measuring module 140 may serve as a voltage sensor and measure both-end voltage of a battery cell (for example, a pouch-type secondary battery). The voltage measuring module 140 may employ various voltage sensors known at the time of filing of this application, and the present disclosure is not limited to a specific form or type of the voltage measuring module 140.

The measuring cable 150 may be configured to be located between the voltage measuring module 140 and the contact probe 110. Both ends of the measuring cable 150 may be connected between the voltage measuring module 140 and the contact probe 110, so that the voltage measuring module 140 may be configured to measure the voltage of the contact probe 110. For example, when the contact probe 110 contacts the electrode lead 11 of the pouch-type secondary battery, the voltage measuring module 140 may be configured to measure both-end voltage of the pouch-type secondary battery.

The measuring cable 150 may include a positive electrode measuring cable 151 and a negative electrode measuring cable 152 so as to be connected between the voltage measuring module 140 and the positive electrode probe 111 and between the voltage measuring module 140 and the negative electrode probe 112. That is, the positive electrode measuring cable 151 may be connected between the voltage measuring module 140 and the positive electrode probe 111, and the negative electrode measuring cable 152 may be connected between the voltage measuring module 140 and the negative electrode probe 112.

Like the power cable 130, the measuring cable 150 may be configured in the form of an electric wire, but may be configured in various other forms.

The switching module 160 may be configured to selectively connect the voltage measuring module 140 to the power cable 130 or the measuring cable 150. That is, the switching module 160 may be configured to select whether to connect the voltage measuring module 140 to the measuring cable 150 or to connect the voltage measuring module 140 to the power cable 130.

In particular, the switching module 160 may include a positive electrode switching module 161 and a negative electrode switching module 162. At this time, the positive electrode switching module 161 may be configured to selectively connect the voltage measuring module 140 to the positive electrode power cable 131 or the positive electrode measuring cable 151, and the negative electrode switching module 162 may be configured to selectively connect the voltage measuring module 140 to the negative electrode power cable 132 or the negative electrode measuring cable 152.

As a more specific example, the switching module 160 may be configured in the form of a 3-contact point switch, as shown in FIG. 2. For example, seeing the positive electrode switching module 161 in FIG. 2, it has three contact points c1, c3 and c4. In addition, the positive electrode switching module 161 may connect the contact point c1 to the contact point c3 or connect the contact point c1 to the contact point c4 through a switching operation. Here, the contact point c1 may be a contact point at the voltage measuring module 140, the contact point c3 may be a contact point at the positive electrode power cable 131, and the contact point c4 may be a contact point at the positive electrode measuring cable 151. If the switching module 160 is configured as shown in the figures such that the contact point c1 is connected to the contact point c4, the voltage measuring module 140 may be connected to the positive electrode measuring cable 151. Meanwhile, if the switching module 160 is configured such that the contact point c1 is connected to the contact point c3, the voltage measuring module 140 may be connected to the positive electrode power cable 131.

In addition, seeing the negative electrode switching module 162 in FIG. 2, it has three contact points c2, c5 and c6. In addition, the negative electrode switching module 162 may connect the contact point c2 to the contact point c5 or connect the contact point c2 to the contact point c6 through a switching operation. Here, the contact point c2 may be a contact point at the voltage measuring module 140, the contact point c5 may be a contact point at the negative electrode power cable 132, and the contact point c6 may be a contact point at the negative electrode measuring cable 152. If the switching module 160 is configured as shown in the figure such that the contact point c2 is connected to the contact point c6, the voltage measuring module 140 may be connected to the negative electrode measuring cable 152. Meanwhile, if the switching module 160 is configured such that the contact point c2 is connected to the contact point c5, the voltage measuring module 140 may be connected to the negative electrode power cable 132.

Meanwhile, the above embodiment has been described based on the case where the switching module 160 is provided in the 3-contact point switching form, but the present disclosure is not necessarily limited to this form. That is, the switching module 160 may be configured in various forms capable of selectively connecting the voltage measuring module 140 to the power cable 130 or the measuring cable 150.

The control module 170 may be configured to control the switching module 160. For example, the control module 170 may control the positive electrode switching module 161 to connect the contact point c1 to the contact point c4 and control the negative electrode switching module 162 to connect the contact point c2 to the contact point c6 in order to connect the voltage measuring module 140 to the measuring cable 150. Alternatively, the control module 170 may control the positive electrode switching module 161 to connect the contact point c1 to the contact point c3 and control the negative electrode switching module 162 to connect the contact point c2 to the contact point c5 in order to connect the voltage measuring module 140 to the power cable 130.

The control module 170 may be electrically connected to the voltage measuring module 140 to send and receive signals. In particular, the control module 170 may receive a voltage measurement value by the voltage measuring module 140 from the voltage measuring module 140. In addition, the control module 170 may judge whether an internal component of the battery inspection apparatus 100 is abnormal, based on the voltage measurement value received in this way.

In particular, the control module 170 may perform self-diagnosis for the battery inspection apparatus 100 based on the voltage measurement value of the voltage measuring module 140 according to the connection state of the switching module 160. For example, the control module 170 may receive the voltage measurement value of the voltage measuring module 140 as a first voltage value in a state where the switching module 160 connects the voltage measuring module 140 with the power cable 130. In addition, the control module 170 may receive the voltage measurement value of the voltage measuring module 140 as a second voltage value in a state where the switching module 160 connects the voltage measuring module 140 with the measuring cable 150. In addition, the control module 170 may judge whether the battery inspection apparatus 100 is abnormal based on the first voltage value and the second voltage value.

Moreover, the control module 170 may be configured to judge whether the contact probe 110 and/or the power cable 130 is abnormal based on whether the battery inspection apparatus 100 is abnormal. That is, when a problem occurs in the contact probe 110 or the power cable 130, the control module 170 may detect the occurrence of such a problem.

According to this configuration of the present disclosure, whether there is a problem in the battery inspection apparatus 100 itself may be self-diagnosed. In particular, according to this embodiment, when there is an abnormality at a portion contacting the battery (the contact probe 110) or at a path to which power is supplied (the power cable 130), the battery inspection apparatus 100 may easily detect the abnormality.

Accordingly, in this case, the accuracy of the battery inspection apparatus 100 may be further improved. In particular, it is possible to prevent the secondary battery from being incorrectly diagnosed as having a problem due to an abnormality of the contact probe 110 or the power cable 130 even though there is no problem in the battery 10 itself, for example the pouch-type secondary battery itself.

Meanwhile, the control module 170 may optionally include CPU (Central Processing Unit), GPU (Graphic Processing Unit), ASIC (application-specific integrated circuit), chipsets, logic circuits, registers, communication modems, data processing devices, or the like, known in the art, to execute various control logics performed in the present disclosure, or may be expressed using these terms. In addition, when a control logic is implemented in software, the control module 170 may be implemented as a set of program modules. In this case, the program module may be stored in a memory and executed by the control module 170. The memory may be provided inside or outside the processor 130, and may be connected to the control module 170 through various well-known means. Meanwhile, in this specification, the term 'configured to be' with respect to the control module 170 and the like may include the meaning of 'programmed to be'.

The battery inspection apparatus 100 according to the present disclosure may further include a pressing module 183. This will be described in more detail with reference to FIG. 3.

Figure 3:
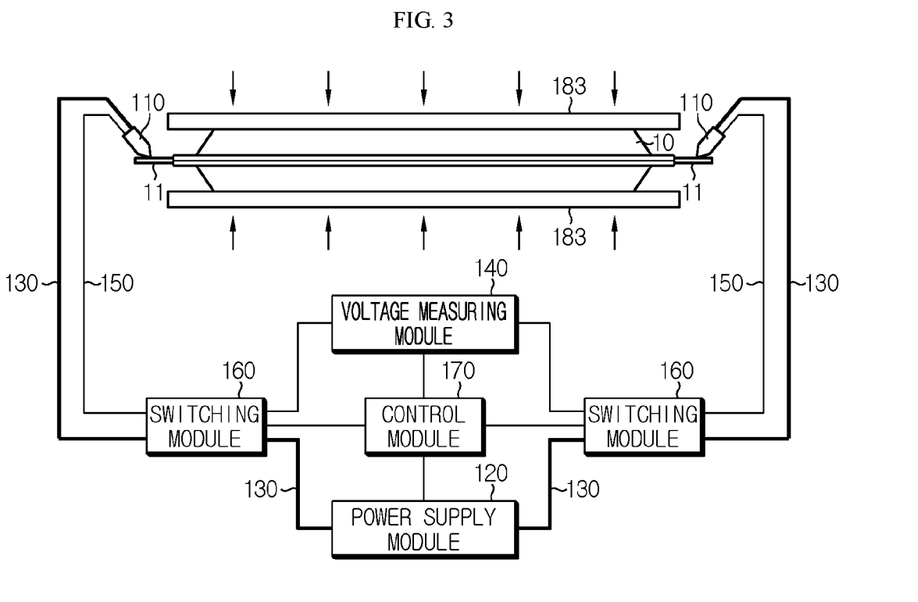
FIG. 3 is a diagram schematically showing the configuration of a battery inspection apparatus according to another embodiment of the present disclosure.

FIG. 3 is a diagram schematically showing the configuration of a battery inspection apparatus 100 according to another embodiment of the present disclosure.

Referring to FIG. 3, the battery inspection apparatus 100 further includes the pressing module 183, and the pressing module 183 may be configured to press the battery. The pressing module 183 may press the battery such that the electrode assembly may receive pressure in the battery. For example, the pouch-type secondary battery may include an accommodation portion in which the electrode assembly and the electrolyte are accommodated, and a sealing portion formed to surround the accommodation portion. In this case, the pressing module 183 may be configured to press the accommodation portion of the pouch-type secondary battery so that the electrode assembly accommodated therein is pressed.

In addition, the control module 170 may control the pressing module 183 so that the battery is pressed by the pressing module 183. In addition, the control module 170 may control the power supply module 120 to supply power to the battery 10 while the battery is pressed as described above.

Moreover, the control module 170 may control the switching module 160 so that the voltage measuring module 140 and the measuring cable 150 are directly connected. For example, in the embodiment of FIG. 2, the control module 170 connects the contact point c1 to the contact point c4 and connect the contact point c2 to the contact point c6 for the positive electrode switching module 161 and the negative electrode switching module 162, respectively, so that the voltage measuring module 140 and the measuring cable 150 are directly connected.

In addition, if the voltage measuring module 140 measures a voltage while the voltage measuring module 140 and the measuring cable 150 are connected as described above, the measured voltage value may be transmitted to the control module 170. Then, the control module 170 may be configured to detect an internal short circuit of the battery 10 based on the transmitted voltage measurement value. That is, the control module 170 may inspect whether an internal short circuit exists in the battery 10 based on the voltage measurement value between both ends of the battery 10.

According to this configuration of the present disclosure, whether the battery 10 has an internal short circuit or not may be detected more effectively. For example, if a part of the separator of the electrode assembly inside the battery 10 is damaged or torn, an internal short circuit condition may occur when the battery 10 is pressed, even if an internal short circuit condition does not occur when the battery 10 is not pressed. That is, as the battery 10 is pressed, the positive electrode plate and the negative electrode plate of the electrode assembly become closer, so that the positive electrode plate and the negative electrode plate may be easily in contact with each other through the damaged part of the separator. Therefore, in this case, a battery 10 in which there is a possibility that an internal short circuit may occur may be detected more easily.

Meanwhile, in FIG. 3, the pressing module 183 is illustrated in the form of pressing one battery cell, namely one pouch-type secondary battery, but the pressing module 183 may also be configured to press a plurality of battery cells, for example a plurality of pouch-type secondary batteries. In addition, the pressing module 183 may be configured in the form of pressing a battery module or a battery pack.

In the above embodiment, if it is judged that the battery 10 has an internal short circuit, the control module 170 may be configured to judge whether the contact probe 110 and/or the power cable 130 is abnormal. That is, if it is not judged that the battery 10 has an internal short circuit, the control module 170 may not judge whether the contact probe 110 and/or the power cable 130 is abnormal. In addition, the control module 170 may be configured to control the switching module 160 to judge whether the contact probe 110 and/or the power cable 130 is abnormal only when it is judged that the battery 10 has an internal short circuit.

In this case, since unnecessary failure self-diagnosis is prevented, self-diagnosis efficiency of the battery inspection apparatus 100 according to the present disclosure may be further improved.

Preferably, the control module 170 may be configured to compare the voltage measurement value with a criterion voltage value. Here, the criterion voltage value is a reference value to be compared with the voltage measurement value, and may be stored in advance. In particular, the criterion voltage value may be set to a specific value or a specific range that is judged as normal or failure for the voltage measurement value.

In addition, the control module 170 may be configured to judge whether the contact probe 110 and/or the power cable 130 is abnormal by comparing the voltage measurement value and the criterion voltage value.

For example, if the voltage measurement value is out of the range set as the criterion voltage value, it may be judged that at least one of the contact probe 110 and the power cable 130 is abnormal. Alternatively, if the voltage measurement value is higher or lower than the numeral set as the criterion voltage value, it may be judged that there is an error in the contact probe 110 and/or the power cable 130.

According to this configuration of the present disclosure, the failure of the battery inspection apparatus 100 may be more easily diagnosed through comparison between the voltage measurement value and the criterion voltage value.

The battery inspection apparatus according to the present disclosure may further include a memory module 181 as shown in FIG. 1. In particular, the memory module 181 may be configured to store the criterion voltage value. In addition, the criterion voltage value of the memory module 181 stored in this way may be configured to be accessible by the control module 170. That is, the control module 170 may be connected to the memory module 181, read the criterion voltage value stored in the memory module 181, and compare it with the voltage measurement value measured by the voltage measuring module 140.

In addition, the control module 170 may store data necessary to perform functions of at least some components of the battery inspection apparatus 100 according to the present disclosure. The type of the memory module 181 is not particularly limited as long as it is a known information storage means capable of writing, erasing, updating and reading data. As an example, the information storage means may include RAM, flash memory, ROM, EEPROM, registers, and the like. In addition, the memory module 181 may store program codes in which processes executable by the control module 170 are defined.

Moreover, the criterion voltage value may be set for each temperature. For example, the memory module 181 may store a criterion voltage value table in which criterion voltage values according to temperature are set separately. In this case, the temperature may be set for each section. For example, a plurality of temperature sections such as 0° C. or less, 10° C. to 20° C., 20° C. to 30° C., 30° C. to 40° C., 40° C. to 50° C., . . . may be set, and a criterion voltage value corresponding to each temperature section may be set and stored in advance.

As a more specific example, the memory module 181 may store in advance a criterion voltage value corresponding to each of the plurality of temperature sections as follows.

0° C. or below: R1,
10° C. to 20° C.: R2,
20° C. to 30° C.: R3,
30° C. to 40° C.: R4,
40° C. to 50° C.: R5,
50° C. or above: R6

In addition, the control module 170 may select a criterion voltage value corresponding to a current temperature and compare it with the voltage measurement value.

For example, when the current temperature is 35° C., it may be regarded as being included in the temperature range of 30° C. to 40° C., so the control module 170 may select R4 as a criterion voltage value corresponding thereto. In addition, the control module 170 may perform self-failure diagnosis by comparing the criterion voltage value R4 with the voltage measurement value. As another example, when the current temperature is 15° C., it may be regarded as being included in the temperature range of 10° C. to 20° C., so the control module 170 may select R2 as a criterion voltage value corresponding thereto. In addition, the control module 170 may compare the criterion voltage value R2 with the voltage measurement value.

According to this configuration of the present disclosure, an abnormality diagnosis may be performed more accurately. In particular, resistance components such as the battery 10, the power cable 130 and the contact probe 110 may vary depending on temperature. According to the above embodiment of the present disclosure, since the criterion voltage value is set appropriately for each temperature, abnormalities in the battery, the contact probe 110 and/or the power cable 130 may be more accurately diagnosed.

In particular, as shown in FIG. 1, the battery inspection apparatus 100 according to the present disclosure may further include a temperature measuring module 182. The temperature measuring module 182 is a component for measuring the surrounding temperature, and may employ various temperature sensors or the like known at the time of filing of this application. In addition, the temperature measuring module 182 may be connected to the control module 170 to transmit the measured temperature information from the temperature measuring module 182 to the control module 170. Then, based on the received temperature information, the control module 170 may find a criterion voltage value corresponding thereto.

In addition, the control module 170 may be configured to judge whether at least one of the contact probe 110 and the power cable 130 is abnormal, based on the first voltage value. Here, the first voltage value is a voltage value measured by the voltage measuring module 140 in a state where the switching module 160 is controlled to connect the voltage measuring module 140 to the power cable 130. For example, in the embodiment of FIG. 2, in a state where the contact point c1 is connected to the contact point c3 for the positive electrode switching module 161 and the contact point c2 is connected to the contact point c5 for the negative electrode switching module 162, the voltage value measured by the voltage measuring module 140 may be the first voltage value. The configuration for measuring the first voltage value will be described in more detail with reference to FIGS. 4 and 5.

Figure 4:
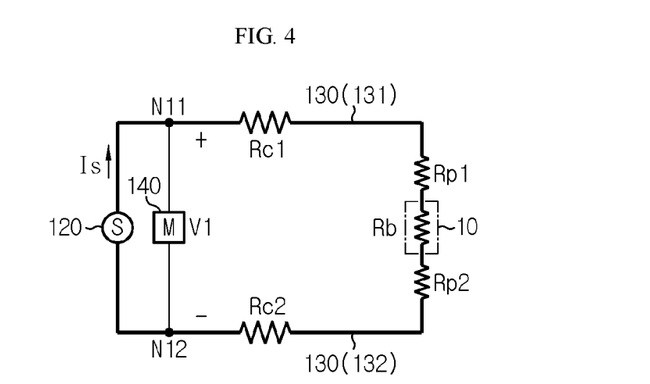
FIG. 4 is a diagram schematically showing the circuit configuration in which a voltage measuring module is connected with a power cable, in the battery inspection apparatus according to an embodiment of the present disclosure.

FIG. 4 is a diagram schematically showing the circuit configuration in which the voltage measuring module 140 is connected with the power cable 130, in the battery inspection apparatus 100 according to an embodiment of the present disclosure. In FIG. 4, for convenience of explanation, in the battery inspection apparatus 100, only the power supply module 120, the voltage measuring module 140, and the power cable 130 are shown, and other components are not shown. In addition, FIG. 5 is a diagram showing the circuit configuration of FIG. 4 using a simpler equivalent circuit.

First, referring to FIG. 4, both ends of the voltage measuring module 140 are directly connected to the power cable 130. In this state, only the power cable 130 is connected to the contact probe 110, and the measuring cable 150 is not connected, which may be regarded as a 2-terminal state. In addition, in the drawing, nodes to which the voltage measuring module 140 and the power cable 130 are connected are indicated by N11 and N12. In this case, the voltage measuring module 140 may measure the voltage between the node N11 and the node N12, and the voltage measured at this time is indicated by V1. That is, when the power supply module 120 supplies a current of a certain magnitude to the battery as indicated by Is, the voltage between both ends of the voltage measuring module 140 (the voltage between the nodes N11 and N12) may be measured as the first voltage value V1. At this time, several resistance components may exist between both ends of the voltage measuring module 140. These resistance components include an internal resistance of the battery 10 as indicated by Rb, resistances of the positive electrode power cable 131 and the negative electrode power cable 132 as indicated by Rc1 and Rc2, and resistances of the positive electrode probe 111 and the negative electrode probe 112 as indicated by Rp1 and Rp2.

Figure 5:
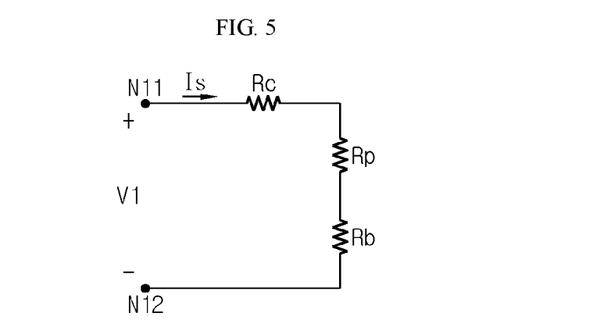
FIG. 5 is a diagram showing the circuit configuration of FIG. 4 using a simpler equivalent circuit.

In addition, when Rc1 and Rc2, which are resistances of the power cable 130, are represented by one equivalent resistance Rc and Rp1 and Rp2, which are resistances of the measuring cable 150, are represented by another equivalent resistance Rp, it may be shown in FIG. 5.

Accordingly, based on the configuration of FIG. 5, the first voltage value V1 measured by the voltage measuring module 140 may be expressed as Equation 1 below.

$$V1 = Is \times (Rc + Rp + Rb) \quad \text{(Equation 1)}$$

Here, Is is the magnitude of the current supplied by the power supply module 120, Rc is the resistance of the power cable 130, Rp is the resistance of the contact probe 110, and Rb is the resistance of the battery 10.

In this configuration, the control module 170 may be configured to judge whether at least one of the contact probe 110 and the power cable 130 is abnormal, based on the first voltage value V1 measured by the voltage measuring module 140.

That is, in Equation 1, V1 may be transmitted from the voltage measuring module 140. In addition, Is may be transmitted from the power supply module 120 or a value known in advance by the control module 170. Accordingly, the control module 170 may judge whether (Rc+Rp+Rb) is an appropriate value. Moreover, if Rb, which is the internal resistance of the battery, is known in advance, the control module 170 may judge whether 'Rc+Rp' is an appropriate value or not. Therefore, the control module 170 may judge whether the resistance (Rc) of the power cable 130 and the resistance (Rp) of the contact probe 110 are appropriate, to judge whether the power cable 130 or the contact probe 110 is abnormal.

In particular, the control module 170 may compare the first voltage value V1 with a specific criterion voltage value (first criterion voltage value). In this case, the first criterion voltage value may be a reference value to be compared with the first voltage value V1 in the configuration of FIG. 5. The first criterion value may be stored in advance in the memory module 181 or the like. In this case, the control module 170 may read the first criterion value from the memory module 181 and compare the read first criterion value with the first voltage value V1 measured by the voltage measuring module 140.

In addition, the control module 170 may be configured to judge whether at least one of the contact probe 110 and the power cable 130 is abnormal according to whether the first voltage value V1 differs from the first criterion value by a predetermined level or more. For example, the control module 170 may judge that the contact probe 110 or the power cable 130 is abnormal, if the first voltage value V1 is out of the range of the first criterion value. As in Equation 1 above, if Is is determined, factors that can affect V1 are Rc, Rp, and Rb. Moreover, if Rb is determined or known in advance, factors that can affect V1 are Rc and Rp. Therefore, by figuring out whether Rc or Rp is abnormal through V1, it is possible to judge whether the contact probe 110 or the power cable 130 is abnormal. Meanwhile, if the first voltage value V1 does not exceed the range of the first criterion value, the control module 170 may judge that there is no abnormality in both the contact probe 110 and the power cable 130.

Meanwhile, when the switching module 160 is connected to the power cable 130, the switching module 160 may be configured to be connected as close to the power supply module 120 as possible from the power cable 130 so that the resistance component of the power cable 130 is included as much as possible. For example, in the embodiment of FIG. 2, the contact point c3 and the contact point c5 may be provided at an end of the power cable 130 near the power supply module 120 among both ends of the power cable 130, or as close to the end as possible.

In the configuration, the control module 170 may be configured to judge whether the contact probe 110 is abnormal based on the second voltage value. Here, the second voltage value is a voltage value measured by the voltage measuring module 140 in a state where the switching module 160 is controlled to connect the voltage measuring module 140 to the measuring cable 150. For example, in the embodiment of FIG. 2, in a state where the contact point c1 is connected to the contact point c4 for the positive electrode switching module 161 and the contact point c2 is connected to the contact point c6 for the negative electrode switching module 162, the voltage value measured by the voltage measuring module 140 may be the second voltage value. The configuration for measuring the second voltage value will be described in more detail with reference to FIGS. 6 and 7.

Figure 6:
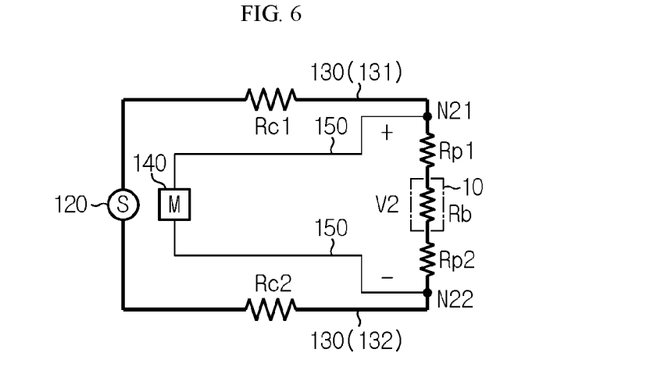
FIG. 6 is a diagram schematically showing the circuit configuration in which the voltage measuring module is connected to a measuring cable, in the battery inspection apparatus according to an embodiment of the present disclosure.

FIG. 6 is a diagram schematically showing the circuit configuration in which the voltage measuring module 140 is connected to the measuring cable 150, in the battery inspection apparatus 100 according to an embodiment of the present disclosure. In FIG. 6, also, only the power supply module 120, the voltage measuring module 140, the power cable 130, and the measuring cable 150 are shown. Also, FIG. 7 is a diagram showing the circuit configuration of FIG. 6 using a simpler equivalent circuit.

First, referring to FIG. 6, both ends of the voltage measuring module 140 are directly connected to the measuring cable 150. In addition, the measuring cable 150 may be connected to the contact probe 110 at the nodes indicated by N21 and N22. Accordingly, unlike the configuration of FIG. 4, in the configuration of FIG. 6, four cables are connected to the contact probe 110, which may be regarded as 4-terminal connection. Meanwhile, although resistance may exist in the measuring cable 150 in the configuration of FIG. 6, its magnitude may be very small compared to the power cable 130. In particular, in the case of a conventionally known battery inspection device such as a battery short circuit inspection device, a battery leakage current inspection device, and a low-voltage inspection device, the resistance of the measuring cable 150 is very small compared to the resistance of the power cable 130 to which current or the like is supplied, and thus negligible. Accordingly, the resistance of the measuring cable 150 is not indicated even in FIG. 6.

In this configuration, the voltage measuring module 140 may measure the voltage between the node N21 and the node N22, and the voltage measured at this time is indicated by V2. That is, if the power supply module 120 supplies a current of a certain magnitude to the battery 10 as indicated by Is, the voltage between both ends of the voltage measuring module 140 (the voltage between the nodes N21 and N22) may be measured as the second voltage value V2. In this case, between both ends of the voltage measuring module 140, the internal resistance of the battery 10 as indicated by Rb and the resistance of the contact probe 110 as indicated by Rp1 and Rp2 may be included together. In addition, since the voltage measuring module 140 is not connected to the power cable 130, unlike the embodiment of the measurement of the first voltage value V1 of FIG. 4 above, when measuring the second voltage value V2, the resistance Rc1, Rc2 of the power cable 130 may be excluded.

Figure 7:
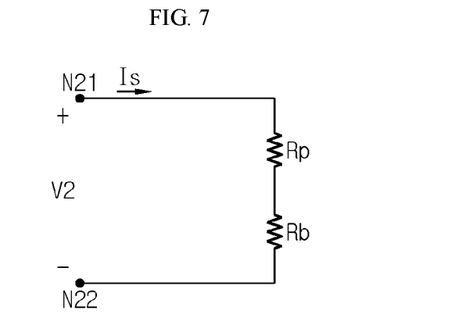
FIG. 7 is a diagram showing the circuit configuration of FIG. 6 using a simpler equivalent circuit.

In addition, Rp1 and Rp2, which are the resistances of the measuring cable 150, are expressed as one equivalent resistance Rp, as shown in FIG. 7.

Accordingly, based on the configuration of FIG. 7, V2 may be expressed as Equation 2 below.

$$V2 = Is \times (Rp + Rb) \quad \text{(Equation 2)}$$

Here, Is is the magnitude of the current supplied by the power supply module 120, Rp is the resistance of the contact probe 110, and Rb is the resistance of the battery 10.

In this configuration, the control module 170 may be configured to judge whether the contact probe 110 is abnormal, based on the second voltage value V2 measured by the voltage measuring module 140.

That is, in the Equation 2, V2 may be transmitted from the voltage measuring module 140, and Is may be transmitted from the power supply module 120 or a value known in advance by the control module 170. Accordingly, the control module 170 may judge whether (Rp+Rb) is an appropriate value. Moreover, if Rb, which is the internal resistance of the battery, is known in advance, the control module 170 may judge whether 'Rp' is an appropriate value or not. Therefore, the control module 170 may judge whether the resistance Rp of the contact probe 110 is appropriate or not, thereby judging whether the contact probe 110 is abnormal or not.

Also, the control module 170 may compare the second voltage value V2 with a specific criterion voltage value (second criterion voltage value) to diagnose whether the contact probe 110 is abnormal. In this case, the second criterion voltage value is a value to be compared with the second voltage value V2, and may be a value related to the sum of Rp and Rb in the configuration of FIG. 7, or a value related to a single value of Rp. The second criterion value may be stored in advance in the memory module 181 or the like. In this case, the control module 170 may read the second criterion value from the memory module 181 and compare the read second criterion value with the second voltage value V2 measured by the voltage measuring module 140.

In addition, the control module 170 may be configured to distinguish whether the contact probe 110 is abnormal according to whether the second voltage value V2 differs from the second criterion value by a predetermined level or more. For example, the control module 170 may judge that the contact probe 110 is abnormal, if the second voltage value V2 is out of the range of the second criterion value. Meanwhile, the control module 170 may judge that the contact probe 110 is not abnormal, if the second voltage value V2 does not deviate from the range of the second criterion value.

In this embodiment, if it is judged that the contact probe 110 and/or the power cable 130 is abnormal based on the first voltage value, the control module 170 may be configured to distinguish which of the contact probe 110 and the power cable 130 is abnormal based on the second voltage value.

For example, the control module 170 may judge that at least one of the power cable 130 and the contact probe 110 has a problem by comparing the first voltage value V1 with the first criterion value, as described above in the embodiment of FIGS. 4 and 5. However, it may not be possible to distinguish which of the power cable 130 or the contact probe 110 has a problem by the first voltage value V1. In this case, the control module 170 may judge whether a problem has occurred in the contact probe 110 by comparing the second voltage value V2 with the second criterion value, as described above in the embodiment of FIGS. 6 and 7. If it is judged that the contact probe 110 has no problem as a result of using the second voltage value V2 but it is judged that the contact probe 110 has a problem as a result of using the first voltage value V1, it may be judged that the power cable 130 is abnormal, rather than the contact probe 110.

According to this configuration of the present disclosure, it may be easily figured out whether the power cable 130 or the contact probe 110 has a problem, and if there is a problem, which of the power cable 130 or the contact probe 110 has a problem, only with a relatively simple comparison, especially voltage comparison. Therefore, in this case, rapid self-failure diagnosis of the battery inspection apparatus 100 may be possible. In addition, a configuration having such a diagnostic function is not complicated, and the cost may not be high.

Meanwhile, although the embodiments have been described based on a configuration for comparing a voltage measurement value and a criterion voltage value, it is also possible to compare a resistance value obtained by calculating the above equations with a criterion resistance value. For example, the memory module 181 may store a resistance value corresponding to Rc+Rp+Rb, Rc+Rp and/or Rp in advance as a criterion resistance value. In addition, the control module 170 may compare the criterion resistance value and the measured resistance value obtained by the above equations with each other to judge whether the contact probe 110 and/or the power cable 130 is abnormal.

The control module 170 may control the switching module 160 to connect the voltage measuring module 140 and the power cable 130 to each other first. Then, the control module 170 may control the switching module 160 to connect the voltage measuring module 140 and the measuring cable 150 to each other only when it is judged that at least one of the contact probe 110 and the power cable 130 is abnormal. That is, the control module 170 may control the switching module 160 to make a 2-terminal connection, and then control the switching module 160 to make a 4-terminal connection only when it is judged that there is a problem.

For example, in the embodiment of FIG. 2, the control module 170 may control the switching module 160 in a 2-terminal mode to connect the contact point c1 to the contact point c3 and to connect the contact point c2 to the contact point c5. In addition, as described in the embodiment of FIGS. 4 and 5, it is possible to judge whether the contact probe 110 or the power cable 130 is abnormal. In addition, if it is judged that the contact probe 110 or the power cable 130 is abnormal in the judgment process, the control module 170 may control the switching module 160 in the 4-terminal mode to connect the contact point c1 to the contact point c4 and to connect the contact point c2 to the contact point c6 in the embodiment of FIG. 2. In addition, as described in the embodiment of FIGS. 6 and 7, it is possible to judge whether the contact probe 110 is abnormal. If it is judged that the contact probe 110 or the power cable 130 is not abnormal in the configuration provided as in the embodiment of FIGS. 4 and 5, the control module 170 may be configured such that the configuration as in the embodiment of FIGS. 6 and 7 is not formed.

According to this embodiment of the present disclosure, it is possible to reduce the waste of resources or time caused by performing unnecessary control of the switching module 160 or further abnormality judgment in a situation where there is a high possibility that there is no abnormality. Therefore, in this case, more efficient self-diagnosis of the battery inspection apparatus 100 may be possible.

The battery inspection apparatus 100 according to the present disclosure may further include a test kit 184. Here, the test kit 184 may be configured to have a predetermined resistance value. In addition, the test kit 184 may be configured to contact the contact probe 110 instead of the battery 10. For example, the test kit 184 may be regarded as a simulated battery having a shape similar to that of a pouch-type secondary battery so that it may replace the pouch-type secondary battery. In particular, the test kit 184 may have an electrode lead having a shape similar to that of a pouch-type secondary battery. Therefore, when the battery inspection apparatus 100 inspects a pouch-type secondary battery, the test kit 184 may be configured such that the contact probe 110 contacts in a similar manner to the pouch-type secondary battery.

The resistance value of the test kit 184 is a predetermined resistance value, and the corresponding information may be transmitted to the control module 170. For example, the resistance value of the test kit 184 may be stored in the memory module 181, and the control module 170 may access the memory module 181 to figure out the resistance value of the test kit 184.

In particular, the resistance value of the test kit 184 may be regarded as being the same as indicated by Rb in the embodiment of FIGS. 4 to 7. In this case, in judging whether at least one of the contact probe 110 and the power cable 130 is abnormal using the first voltage value V1, the control module 170 may judge whether Rc+Rp is an appropriate value since the Rb, V1 and Is values are identified or transmitted in advance. Also, in judging whether the contact probe 110 is abnormal using the second voltage value V2, the control module 170 may also judge whether Rp is an appropriate value since Rb, V2 and Is are previously identified or transmitted in advance.

Therefore, according to the above embodiment, since Rb is constant and does not change, it is possible to more clearly and quickly figure out whether the contact probe 110 and/or the power cable 130 has a problem and which of them has a problem.

The test kit 184 may be configured to have a changeable resistance. For example, the test kit 184 may include a variable resistor or may be configured as a variable resistor. In addition, the changed resistance value of the variable resistor may be transmitted to the control module 170 or stored in the memory module 181 so that the control module 170 may figure out the changed resistance value. In particular, the control module 170 may judge abnormality based on the change in the voltage measurement value according to the change in the resistance value of the test kit 184.

For example, when the different resistance values of the test kit 184 are Rb1 and Rb2, the control module 170 may whether the contact probe 110 and/or the power cable 130 is abnormal by using the result value obtained when the resistance value is Rb1 and the result value obtained when the resistance value is Rb2 together.

In particular, the control module 170 may be configured to diagnose abnormality when the judgment result when the resistance value is Rb1 and the judge result when the resistance value is Rb2 are the same. For example, if the judgment result when the resistance value is Rb1 is that the contact probe 110 has a problem and also the judgment result when the resistance value is Rb2 is that the contact probe 110 has a problem, the control module 170 may judge that the contact probe 110 has a problem as a final diagnostic result. Meanwhile, if the judgment result when the resistance value is Rb1 is that the contact probe 110 has a problem but the judgment result when the resistance value is Rb2 is that the contact probe 110 has no problem and the power cable 130 has a problem, the control module 170 may withhold the determination of the final diagnostic result. Moreover, in this case, the control module 170 may change the resistance value of the test kit 184 to a different value to perform the diagnosis again under a different resistance value.

According to this configuration of the present disclosure, the accuracy and reliability of diagnosing whether components of the battery inspection apparatus 100 are abnormal may be further improved. In particular, in the case of a general battery 10, it may be difficult to secure accurate measurement because its characteristics may change sensitively to temperature due to an internal resistance component and a capacitor component contained therein. However, when the test kit 184 is used as described above, it is not necessary to consider such a change in characteristic, which may secure a more accurate diagnosis.

Meanwhile, when several resistance values are varied and used as the resistance value of the test kit 184 as described above, a criterion value for each resistance value, for example a criterion voltage value or a criterion resistance value, may be stored separately in the memory module 181 or the like. For example, the memory module 181 may separately store a first criterion voltage value and a second criterion voltage value when the resistance value is Rb1, and a first criterion voltage value and a second criterion voltage value when the resistance value is Rb2, respectively.

Meanwhile, if the test kit 184 does not exist or Rb, which is the internal resistance of the battery 10, cannot be figured out, it is possible to figure out whether the battery inspection apparatus 100 as above is abnormal by performing inspection for a plurality of batteries 10 or performing inspection for a single battery 10 several times.

In addition, in judging whether the power cable 130 is abnormal, the battery inspection apparatus 100 according to the present disclosure may be configured to judge which power cable 130 of the positive electrode power cable 131 and the negative electrode power cable 132 is abnormal.

In particular, the switching module 160 may include at least two unit switching modules 160, namely a positive electrode switching module 161 and a negative electrode switching module 162, as described above. In this case, the control module 170 may be configured to connect the positive electrode switching module 161 and the negative electrode switching module 162 to different cables among the power cable 130 and the measuring cable 150. For example, the control module 170 may perform a switching control operation to connect the positive electrode switching module 161 to the power cable 130 and connect the negative electrode switching module 162 to the measuring cable 150, or to connect the positive electrode switching module 161 to the measuring cable 150 and connect the negative electrode switching module 162 to the power cable 130. In addition, the circuit configuration when the switching module 160 is connected as above is as shown in FIGS. 8 and 9.

Figure 8:
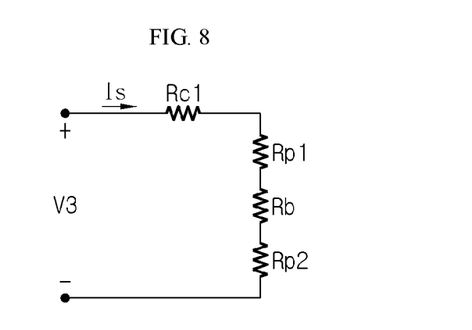
FIG. 8 is a diagram schematically showing the circuit configuration when a positive electrode switching module is connected to the power cable and a negative electrode switching module is connected to the measuring cable, in the battery inspection apparatus according to an embodiment of the present disclosure.
Figure 9:
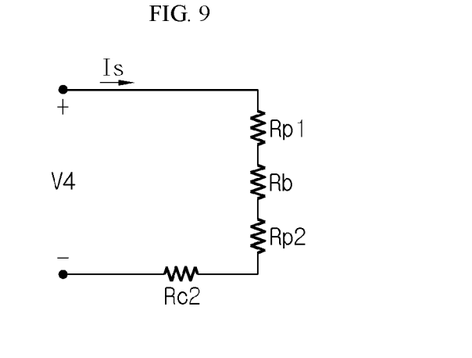
FIG. 9 is a diagram schematically showing the circuit configuration when the positive electrode switching module is connected to the measuring cable and the negative electrode switching module is connected to the power cable, in the battery inspection apparatus according to an embodiment of the present disclosure.

FIG. 8 is a diagram schematically showing the circuit configuration when the positive electrode switching module 161 is connected to the power cable 130 and the negative electrode switching module 162 is connected to the measuring cable 150, in the battery inspection apparatus 100 according to an embodiment of the present disclosure. Also, FIG. 9 is a diagram schematically showing the circuit configuration when the positive electrode switching module 161 is connected to the measuring cable 150 and the negative electrode switching module 162 is connected to the power cable 130, in the battery inspection apparatus 100 according to an embodiment of the present disclosure.

For example, in the configuration of FIG. 2, when the switching module 160 is controlled to be switched such that the contact point c1 is connected to the contact point c3 in the positive electrode switching module 161 and the contact point c2 is connected to the contact point c6 in the negative electrode switching module 162, this be referred to as the configuration of FIG. 8. In addition, in the configuration of FIG. 2, when the switching module 160 is controlled to be switched such that the contact point c1 is connected to the contact point c4 in the positive electrode switching module 161 and the contact point c2 is connected to the contact point c5 in the negative electrode switching module 162, this may be referred to as the configuration of FIG. 9. The configuration of FIGS. 8 and 9 will also be mainly described based on features different from those of the former embodiments.

First, referring to FIG. 8, only the positive electrode power cable 131 is connected to both ends of the voltage measuring module 140, and the negative electrode power cable 132 is not connected. Therefore, the voltage V3 measured by the voltage measuring module 140 may be calculated as a value obtained by multiplying the sum resistance of the resistance Rc1 of the positive electrode power cable 131, the resistance Rp1 of the positive electrode probe, the battery resistance Rb and the resistance Rp2 of the negative electrode probe by current Is, and this may be expressed as an equation as follows.

$$V3 = Is \times (Rc1 + Rp1 + Rb + Rp2) \quad \text{(Equation 3)}$$

In addition, referring to FIG. 9, only the negative electrode power cable 132 is connected to both ends of the voltage measuring module 140, and the positive electrode power cable 131 is not connected. Therefore, the voltage V4 measured by the voltage measuring module 140 may be calculated as a value obtained by multiplying the sum resistance of the resistance Rp1 of the positive electrode probe, the battery resistance Rb, the resistance Rp2 of the negative electrode probe and the resistance Rc2 of the negative electrode power cable 132 by current Is, and this may be expressed as an equation as follows.

$$V4 = Is \times (Rp1 + Rb + Rp2 + Rc2) \quad \text{(Equation 4)}$$

Based on Equations 3 and 4 above, the control module 170 may judge whether the positive electrode power cable 131 and/or the negative electrode power cable 132 is abnormal.

For example, the control module 170 may judge whether the positive electrode power cable 131 is abnormal based on the result of Equation 3. Since Equation 3 includes a factor related to the positive electrode power cable 131 called 'Rc1', it is possible to judge whether the positive electrode power cable 131 is abnormal based on the voltage measurement value called the third voltage value V3. In this case, a criterion value to be compared with V3, namely a criterion voltage value, may be stored in advance in the memory module or the like. More specifically, as a result of comparing the third voltage value V3 of Equation 3 and the criterion voltage value, if the third voltage value V3 is out of the range of the criterion voltage value, the control module 170 may judge that the positive electrode power cable 131 is abnormal.

In addition, the control module 170 may judge whether the negative electrode power cable 132 is abnormal based on the result of Equation 4. Since Equation 4 includes a factor related to the negative electrode power cable 132 called 'Rc2', if the voltage measurement value called the third voltage value V4 is measured, it is possible to judge whether the negative electrode power cable 132 is abnormal based on this. In this case, a criterion value to be compared with V4 may be stored in advance in the memory module or the like. More specifically, as a result of comparing the fourth voltage value V4 of Equation 4 and the criterion voltage value, if the fourth voltage value V4 is out of the range of the criterion voltage value, the control module 170 may judge that the negative electrode power cable 132 is abnormal.

As another example, the control module 170 may be configured to judge whether the positive electrode measuring cable 150 and/or the negative electrode measuring cable 150 is abnormal by comparing the third voltage value V3 obtained in the state as in FIG. 8 and the fourth voltage value V4 obtained in the state as in FIG. 9.

In particular, the control module 170 may compare the third voltage value V3 obtained in Equation 3 with the fourth voltage value V4, and judge that the positive electrode power cable 131 or the negative electrode power cable 132 is abnormal if the difference between them is out of an error range. Moreover, in a situation where the resistance of the positive electrode power cable 131 and the resistance of the negative electrode power cable 132 are likely to be similar to each other, if a difference occurs in the third voltage value V3 and the fourth voltage value V4, it is possible to judge that the positive electrode power cable 131 or the negative electrode power cable 132 has a problem. In addition, the control module 170 may judge whether the positive electrode power cable 131 or the negative electrode power cable 132 is abnormal by comparing which voltage value of the third voltage value V3 and the fourth voltage value V4 deviates from the criterion value.

Figure 10:
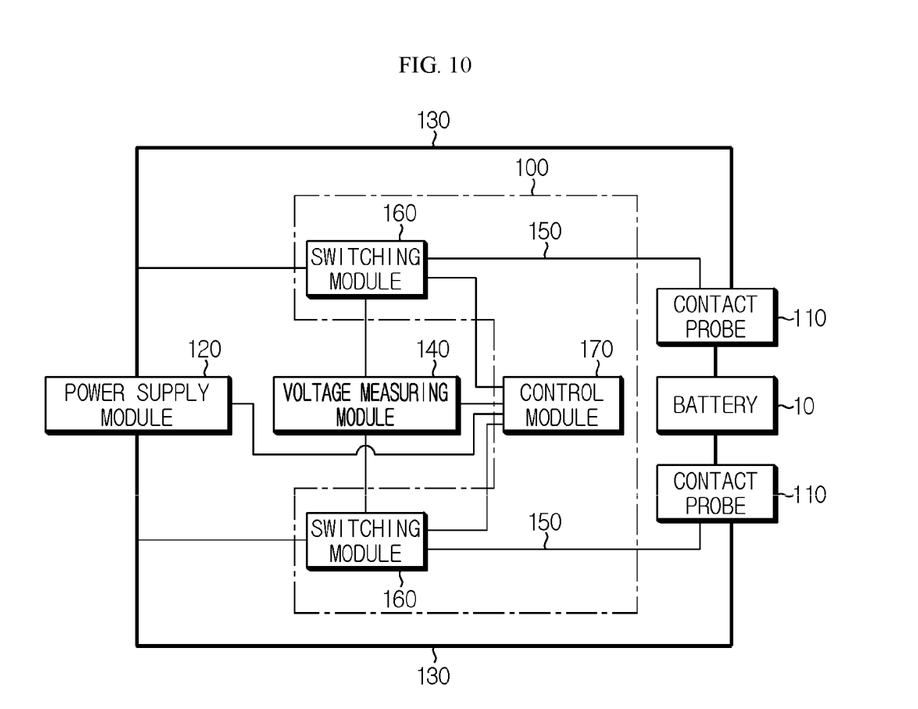
FIG. 10 is a diagram schematically showing the configuration of a battery inspection unit verification device according to another embodiment of the present disclosure.

FIG. 10 is a diagram schematically showing the configuration of a battery inspection unit verification device according to another embodiment of the present disclosure.

Referring to FIG. 10, the battery inspection unit abnormality verification device according to the present disclosure may include a switching module 160 and a control module 170.

Here, the battery inspection unit to be diagnosed by the battery inspection unit abnormality verification device according to another aspect of the present disclosure may include a contact probe 110, a power supply module 120, a power cable 130, a voltage measuring module 140 and a measuring cable 150. The contact probe 110, the power supply module 120, the power cable 130, the voltage measuring module 140, and the measuring cable 150 may be configured identically or similarly to the components of the battery inspection apparatus 100 according to an aspect of the present disclosure as described above.

The switching module 160 is configured to be connectable to the voltage measuring module 140, the power cable 130 and the measuring cable 150, and may be configured to selectively connect the voltage measuring module 140 to the power cable 130 or the measuring cable 150.

In addition, the switching module 160 may be configured to be connectable to the voltage measuring module 140, the power cable 130 and the measuring cable 150, and may be configured to selectively connect the voltage measuring module 140 to the power cable 130 or the measuring cable 150. In particular, the switching module 160 may include a connector so that the voltage measuring module, the power cable and the measuring cable provided in the battery inspection unit such as a conventional battery pressurization short circuit tester, a battery leakage current tester, and a battery low-voltage tester may be connected.

The configuration or operation of the switching module 160 and the control module 170 will not be described in detail here since the configuration or operation of the switching module 160 and the control module 170 of the battery inspection apparatus 100 according to an aspect of the present disclosure described above may be applied identically or similarly.

According to this configuration of the present disclosure, an apparatus capable of effectively diagnosing failure of a conventional battery inspection unit may be provided. That is, when the voltage measuring module, the power cable and the measuring cable are connected to the switching module and the control module is operated in the conventional battery inspection unit, it is possible to quickly and accurately diagnose which of the power cable or the contact probe has a problem.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

- 100: battery inspection apparatus
- 110: contact probe
- 111: positive electrode probe, 112: negative electrode probe
- 120: power supply module
- 130: power cable
- 131: positive electrode power cable, 132: negative electrode power cable
- 140: voltage measuring module
- 150: measuring cable
- 151: positive electrode measuring cable, 152: negative electrode measuring cable
- 160: switching module
- 161: positive electrode switching module, 162: negative electrode switching module
- 170: control module
- 181: memory module
- 182: temperature measuring module
- 183: pressing module
- 184: test kit
- 10: battery
- 11: electrode lead
- 11a: positive electrode lead, 11b: negative electrode lead

What is claimed is:

1. A battery inspection apparatus for inspecting a state of a battery, comprising:
   - a contact probe configured to contact a terminal of the battery;
   - a power supply module configured to generate and supply power;
   - a power cable located between the power supply module and the contact probe to provide a path for supplying the power generated by the power supply module to the contact probe;
   - a voltage measuring module configured to measure a voltage;
   - a measuring cable located between the voltage measuring module and the contact probe, the measuring cable being configured to measure a voltage of the contact probe by the voltage measuring module;
   - a switching module configured to selectively connect the voltage measuring module to the power cable or the measuring cable; and
   - a control module configured to control the switching module and determine whether at least one of the contact probe or the power cable is abnormal based on a voltage measurement value of the voltage measuring module according to a connection state of the switching module.

2. The battery inspection apparatus according to claim 1, further comprising:
   - a pressing module configured to press the battery,
   - wherein, when power is supplied to the battery by the power supply module in a state where the battery is pressed by the pressing module, the control module is configured to detect an internal short circuit of the battery based on the voltage measurement value of the voltage measuring module in a state where the switching module is controlled to connect the voltage measuring module and the measuring cable.

3. The battery inspection apparatus according to claim 1, wherein the battery is a pouch-type secondary battery, wherein the terminal is an electrode lead of the pouch-type secondary battery, and wherein the contact probe is configured to contact the electrode lead of the pouch-type secondary battery.

4. The battery inspection apparatus according to claim 1, wherein the control module is configured to determine whether the at least one of the contact probe or the power cable is abnormal by comparing the voltage measurement value with a previously stored criterion voltage value.

5. The battery inspection apparatus according to claim 4, wherein the criterion voltage value to be compared with the voltage measurement value is different for different temperature ranges.

6. The battery inspection apparatus according to claim 1, wherein the control module is configured to determine whether the at least one of the contact probe or the power cable is abnormal based on a first voltage value measured by the voltage measuring module in a state where the switching module is controlled to connect the voltage measuring module to the power cable.

7. The battery inspection apparatus according to claim 6, wherein the control module is configured to determine whether the contact probe is abnormal based on a second voltage value measured by the voltage measuring module in a state where the switching module is controlled to connect the voltage measuring module to the measuring cable.

8. The battery inspection apparatus according to claim 7, wherein, when it is determined based on the first voltage value that the at least one of the contact probe or the power cable is abnormal, the control module is configured to determine which of the contact probe and the power cable is abnormal based on the second voltage value.

9. The battery inspection apparatus according to claim 8, wherein the control module is configured to control the switching module first to connect the voltage measuring module and the power cable, and then control the switching module to connect the voltage measuring module and the measuring cable only when it is determined that the at least one of the contact probe or the power cable is abnormal.

10. The battery inspection apparatus according to claim 1, further comprising:
   a test kit configured to have a predetermined resistance value to be contacted by the contact probe instead of the battery.

11. A battery inspection unit abnormality verification device for verifying whether a battery inspection unit including a contact probe, a power supply module, a power cable, a voltage measuring module and a measuring cable is abnormal, the battery inspection unit abnormality verification device comprising:
   a switching module configured to be connectable to the voltage measuring module, the power cable and the measuring cable and to selectively connect the voltage measuring module to the power cable or the measuring cable; and
   a control module configured to control the switching module and determine whether at least one of the contact probe or the power cable is abnormal based on a voltage measurement value of the voltage measuring module according to a connection state of the switching module.

\* \* \* \* \*